(12) United States Patent
Sekiya (10) Patent No.: US 6,803,247 B2
(45) Date of Patent: Oct. 12, 2004

(54) METHOD FOR DIVIDING SEMICONDUCTOR WAFER

(75) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 10/475,675

(22) PCT Filed: Feb. 6, 2003

(86) PCT No.: PCT/JP03/01236
§ 371 (c)(1),
(2), (4) Date: Oct. 23, 2003

(87) PCT Pub. No.: WO03/073488
PCT Pub. Date: Sep. 4, 2003

(65) Prior Publication Data
US 2004/0115901 A1 Jun. 17, 2004

(30) Foreign Application Priority Data
Feb. 28, 2002  (JP) .................................. 2002-053436

(51) Int. Cl.[7] .......................... H01L 21/00; H01L 21/46
(52) U.S. Cl. ....................................... 438/33; 438/460
(58) Field of Search ........................... 438/33, 68, 113, 438/460, 462

(56) References Cited
U.S. PATENT DOCUMENTS 5,597,767 A * 1/1997 Mignardi et al. ............ 438/14
6,620,649 B2 * 9/2003 Uchida ....................... 438/107
6,642,127 B2 * 11/2003 Kumar et al. ............... 438/460
6,716,723 B2 * 4/2004 Nepomuceno et al. ...... 438/462

FOREIGN PATENT DOCUMENTS

| JP | 10-256331 | 9/1998 |
|----|-----------|--------|
| JP | 2001-127011 | 5/2001 |
| JP | 2001-148358 | 5/2001 |

* cited by examiner

Primary Examiner—David S. Blum
(74) Attorney, Agent, or Firm—Wenderoth, Lind & Ponack, L.L.P.

(57) ABSTRACT

A method for dicing a semiconductor wafer wherein a semiconductor wafer (W) with circuits in many regions sectioned by crosswise streets is diced into individual semiconductor chips each having a circuit. The circuit face of the semiconductor wafer (W) is covered with a tape member (10), and a part of the tape member (10) covering the top of the streets is removed by cutting to form a cut groove (11). The semiconductor wafer (W) dear of the part of the tape member (10) covering the top of the crosswise streets is chemically etched to erode the crosswise streets and thus diced into individual semiconductor chips. This economical method enables formation of high quality chips free of cracks or stresses.

5 Claims, 7 Drawing Sheets

METHOD FOR DIVIDING SEMICONDUCTOR WAFER

TECHNICAL FIELD

The present invention relates to a dicing method using a chemical etching treatment to divide a semiconductor wafer into individual semiconductor chips.

BACKGROUND ART

Figure 12:
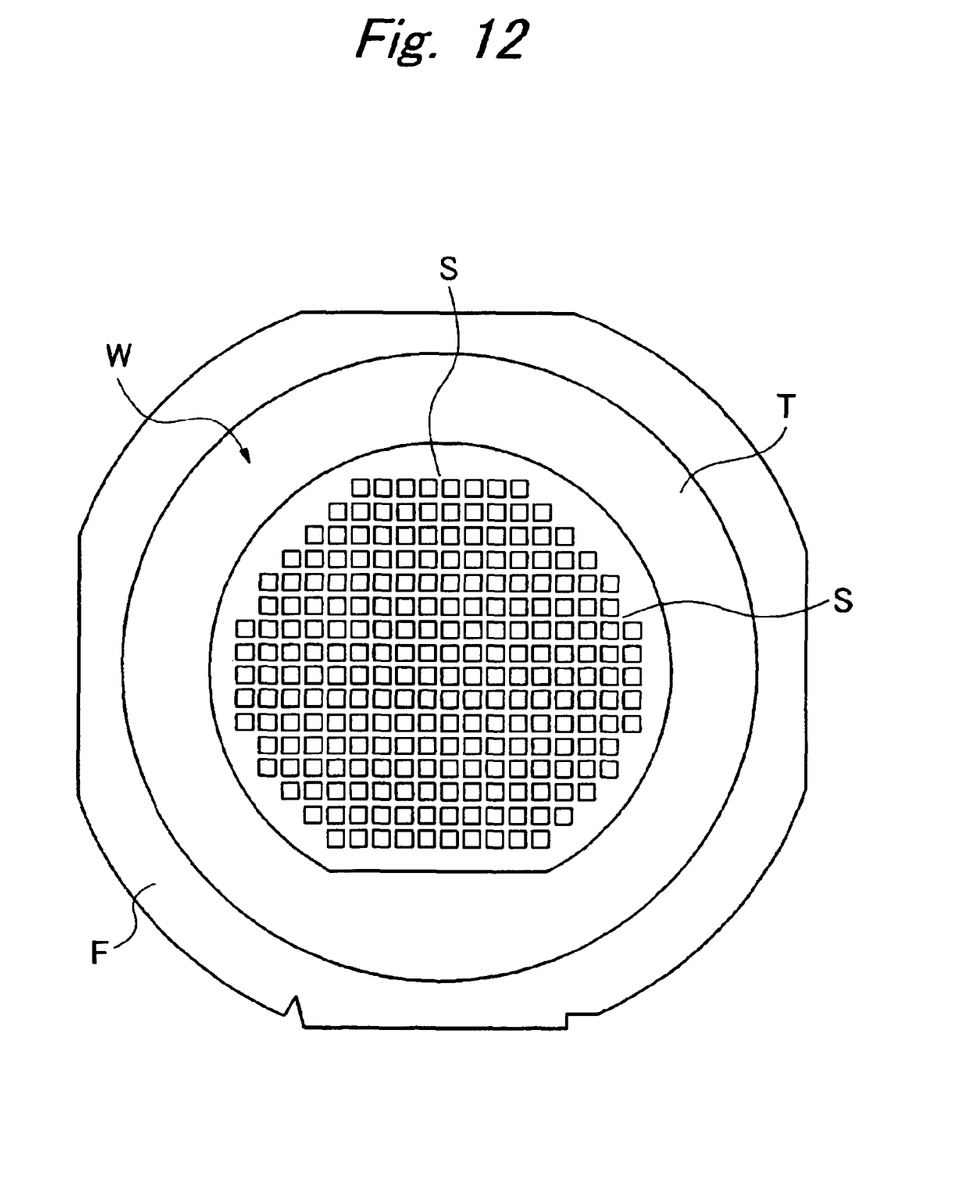
FIG. 12 illustrates a combination of a semiconductor wafer and a frame stuck together with an adhesive tape.

Referring to FIG. 12, a semiconductor wafer W is combined with a frame F as a whole unit, with an adhesive tape T applied therebetween. The semiconductor wafer W has crosswise streets S formed on its front surface. These streets are arranged at regular intervals in the form of lattice to define a lot of rectangular regions each having a circuit pattern formed therein. A rotary blade is used to cut the semiconductor wafer W along the crosswise streets S into individual semiconductor chips.

Semiconductor chips, however, are often cracked or inner-stressed on their edges while being diced by the rotary blades. Such defects are apt to reduce their flexural strength so that they may be susceptible to undesired outer force or thermal cyclic influence to be damaged or shortened in life. This is increasingly conspicuous with semiconductor wafers having a thickness of 50 μm or less, and such cracks or inner stresses are almost fatal to thin wafers.

In the hope of dealing with this problem, the semiconductor wafer dicing method using chemical etching has been studied and proposed. It comprises the steps of: applying a photo-sensitive tape member to the surface of a semiconductor wafer W having a plurality of circuit patterns formed thereon; light-exposing the portions of the tape member lying on the crosswise streets of the semiconductor wafer with a photomask applied on the tape member; removing the exposed crosswise portions of the tape member changed in properties by the light exposure; and eroding the exposed crosswise streets of the semiconductor wafer to divide it into individual semiconductor chips.

However, in order to light-expose only the portions of the tape member lying on the crosswise streets in the method stated above, it is required to prepare a plurality of photomasks which are different in size to exactly conform to different semiconductor wafers to be diced, and which have lattice patterns being different in size of the streets. This is disadvantageous from the economical point of view. Also, a complicated problem is caused in management.

Still disadvantageously, it is necessary to install an exposure apparatus which can precisely align a semiconductor wafer with the overlying photomask in respect of their lattice patterns. In addition, it is necessary to install a coating removal apparatus for selectively removing the portion of the photoresist coating which was exposed to light and changed in properties in the form of lattice pattern. Such extra apparatuses cost much in capital investment.

In case patterns such as an alignment mark are formed on the streets of a semiconductor wafer W with a material which cannot be removed by a chemical etching treatment, the semiconductor wafer W actually cannot be diced by the etching treatment.

Incidentally, it has been proposed a method comprising covering the whole surface of the semiconductor wafer having a plurality of circuit patterns formed thereon with a photoresist coating, mechanically removing the lattice portions of the photoresist coating being exactly in alignment with the underlying crosswise streets of semiconductor wafer with use of a rotary blade, and thereafter chemically etching the semiconductor wafer along the exposed crosswise streets to dice the wafer into individual semiconductor chips, as disclosed e.g. in JP 2001-127011A.

However, in the method stated above, it is difficult to coat the semiconductor wafer with a photoresist coating having a constant thickness. Also, it is practically impossible to coat the semiconductor wafer thick enough to remain on the diced semiconductor wafer even after completing erosion of the semiconductor wafer. As a matter of fact, the coating is eroded and removed from the semiconductor wafer before the semiconductor wafer is completely diced.

Accordingly, in case semiconductor wafers are chemically etched and diced into individual semiconductor chips, there has been a demand that the dicing process should be carried out to surely provide individual semiconductor chips of high quality without cracks and inner stresses, without extra cost required.

DISCLOSURE OF INVENTION

To meet such demand, a method for dicing a semiconductor wafer having regions sectioned by crosswise streets into individual semiconductor chips, each of the regions having a circuit pattern formed therein, comprises at least the following steps according to the present invention, that is, a masking step of covering the semiconductor wafer with a tape member to cover the circuit face of the semiconductor wafer on which the circuit patterns are formed; a selective tape-removing step of mechanically cutting and removing selectively crosswise portions of the tape member which are exactly aligned with the underlying crosswise streets of the semiconductor wafer; and an etching and dividing step of chemically etching the semiconductor wafer having the crosswise streets uncovered, whereby the crosswise streets are permitted to erode so that the semiconductor wafer is divided into individual semiconductor chips.

The thickness of the tape member may be determined in consideration of the depth of the semiconductor wafer to be eroded and divided into individual semiconductor chips. In case that a cover layer which cannot be removed by the chemical etching is formed on the crosswise streets, the cover layer on the crosswise street pattern can be removed by cutting in the selective tape-removing step. The chemical etching may be dry-etching.

As described above, the tape member is applied to the circuit face of the semiconductor wafer, and it is subjected to the selective tape-removing step, whereby the portions of the tape lying along the crosswise streets are cut and removed. The semiconductor wafer thus party uncovered is chemical-etched in the exposed crosswise streets to be divided into individual semiconductor chips. The semiconductor chips thus provided are free of cracks or any other defects, and high in flexural strength. Advantageously, the etching process needs neither photomasks nor exposure equipment. In case semiconductor wafers have a thickness of 50 μm or less, they are most likely to cause cracks or inner-stress when being mechanically cut into semiconductor chips. Even such thin semiconductor wafers can be hardly cracked or inner-stressed when being chemically etched to divide into individual semiconductor chips.

Usually in semiconductor factories, mechanical dicing apparatuses are installed, and therefore, such existing equipment can be used in carrying out the dicing method according to the present invention. No extra investment, therefore, is required for the purpose.

Still advantageously, it does not take a long time to dice 50 or less micron-thick wafers by chemical etching although the time involved for erosion significantly increases for thicker wafers.

In case that semiconductor wafers have crosswise streets covered with a material which cannot be removed by dry etching such as alignment marks, which cannot be removed by etching treatment, they can be removed by driving the rotary blade a few microns deep into the thickness of the semiconductor wafer, thereby making the silicon substrate exposed.

BEST MODE FOR CARRYING OUT THE INVENTION

Figure 1:
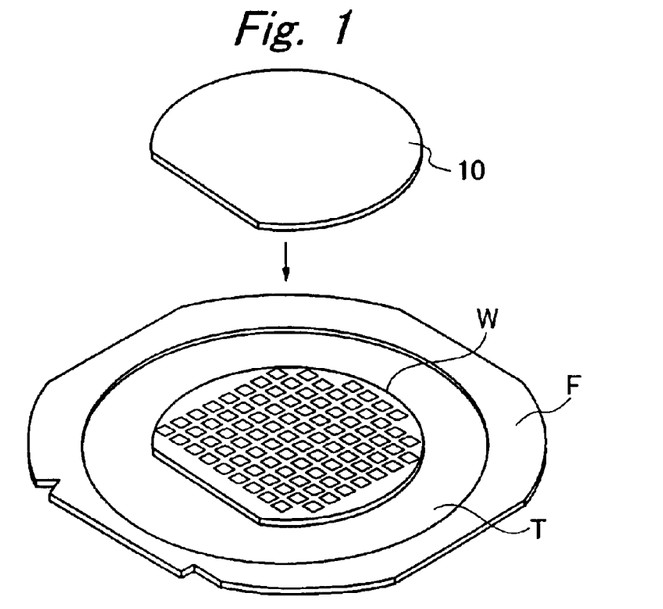
FIG. 1 a perspective view showing masking step in the present invention.

Referring to the accompanying drawings, one of best embodiments of the present invention is described below. Referring to FIG. 1, a semiconductor wafer W is put on an adhesive tape T, which traverses the opening of a frame F. Specifically, the semiconductor wafer W is stuck to the adhesive tape T with its circuit face (front surface) up as a whole unit A tape member 10 is applied to cover the whole front surface of the semiconductor wafer W as seen from FIGS. 2 and 3 (masking step). In this particular embodiment, the masking tape member 10 is transparent, but it may be semi-transparent. The tape member 10 may be a Resist Tape having a predetermined thickness, or an ordinary adhesive tape T or a polyethylene terephthalate (PET) film having an adhesive agent applied to one surface thereof.

Figure 2:
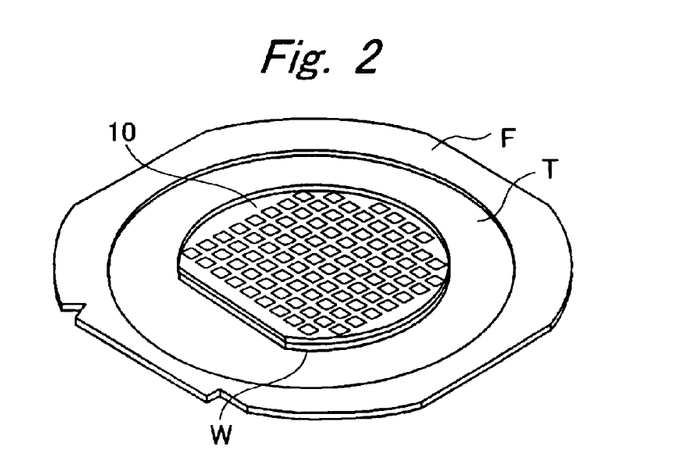
FIG. 2 is a perspective view of a semiconductor wafer having the tape member applied to its front surface.
Figure 3:
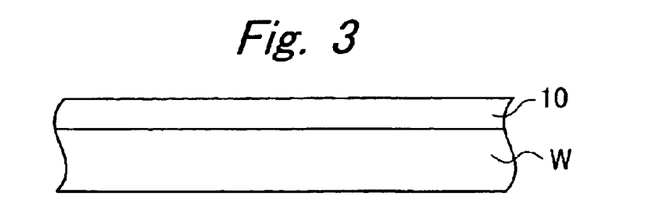
FIG. 3 is a side view of the masked wafer having the tape member applied to its front surface.
Figure 4:
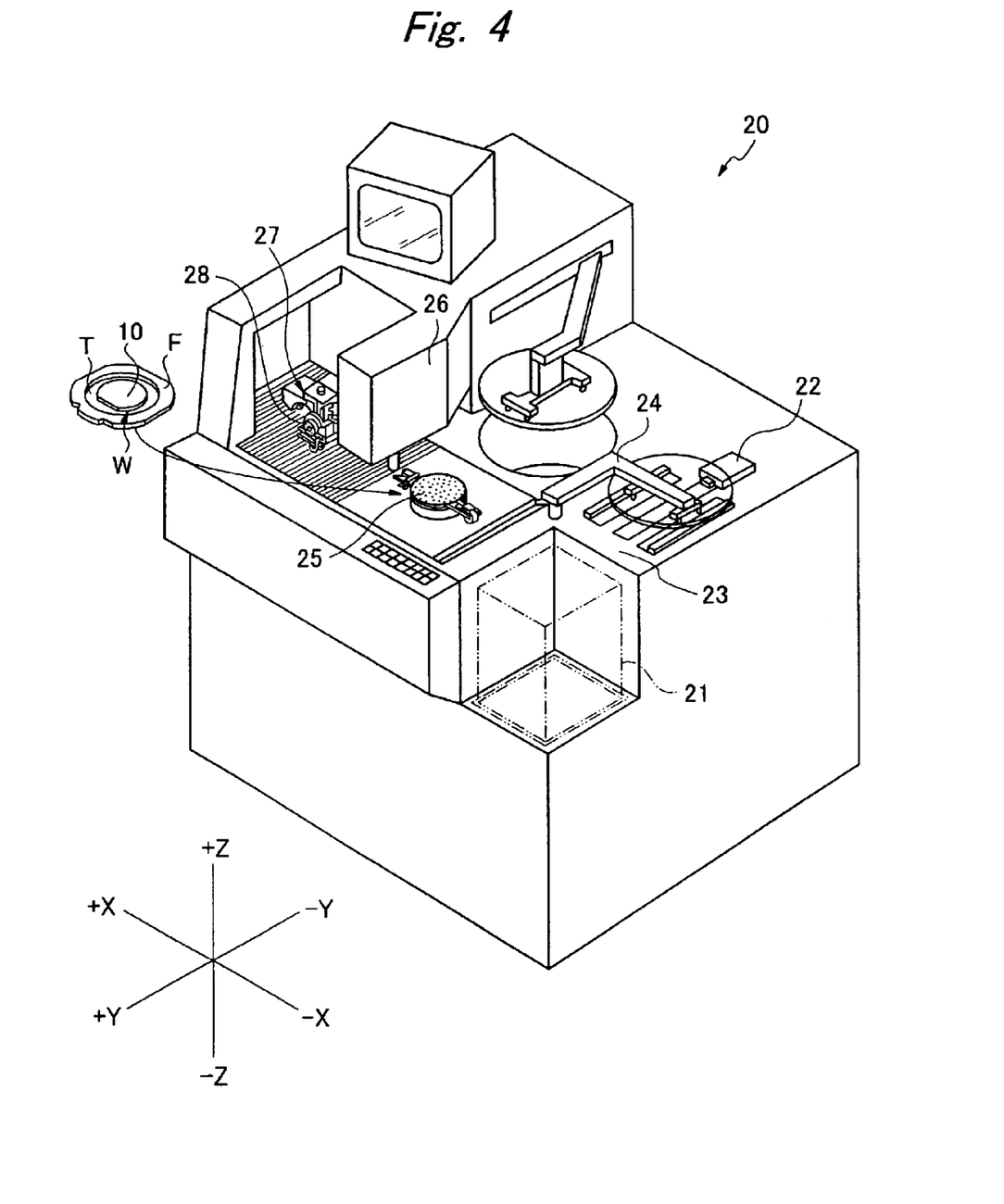
FIG. 4 is a perspective view of a dicing cutter for use in removing a selected part of the tape member in the present invention.

A plurality of the semiconductor wafers W each of which is combined with a frame F as a whole unit via an adhesive tape T and covered the front face with the tape member 10 as shown in FIGS. 2 and 3 are transported to a dicing apparatus 20 as shown in FIG. 4 to be stored in a cassette 21.

The semiconductor wafer W is transported one by one to a tentative depository 23 by a taking-in and -out means 22 and transported by a transfer means 24 while being sucked thereto to a chuck table 25 to be held thereon.

Then, the chuck table 25 is moved in the +X-direction, and the semiconductor wafers W is put below an alignment means 26, which a selected street is detected. A rotary blade 28 of a cutting means 27 is put in alignment with the so detected street in respect of the Y-axial direction. If the tape member 10 is a semi-transparent, infrared rays are used to pass through the tape member 10 for detecting a selected street.

After the required alignment is finished, the chuck table 25 is moved further in the +X-direction. At the same time, the rotary blade 28 rotates at a high speed and descends to cut the tape member 10 along the straight line lying on the selected street.

The rotary blade 28 is precisely controlled in respect of the cut depth, thus not cutting into the underlying semiconductor wafer W.

Figure 5:
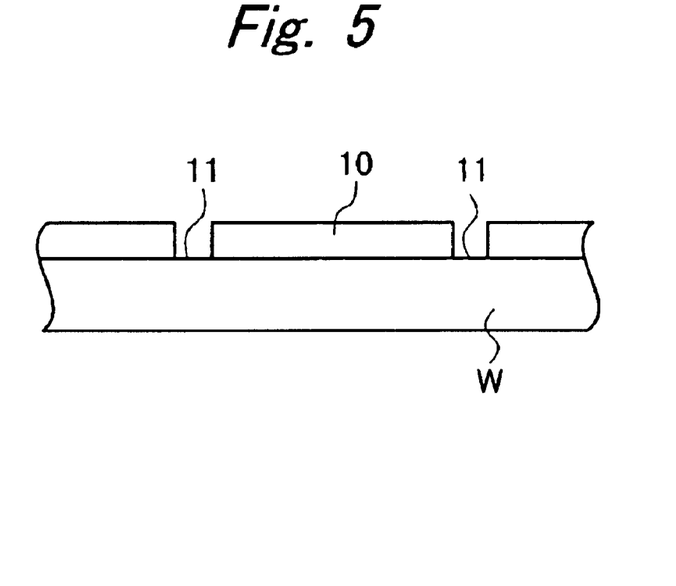
FIG. 5 is a side view of the wafer with the tape member partly removed along the streets.

Every time the cutting means 27 is driven the street-to-street distance in the Y-axial direction, the chuck table 25 is reciprocated in the X-axial direction, whereby the grooves 11 are made parallel to each other in the tape member 10, lying on the X-axial streets, as seen from FIG. 5.

Figure 6:
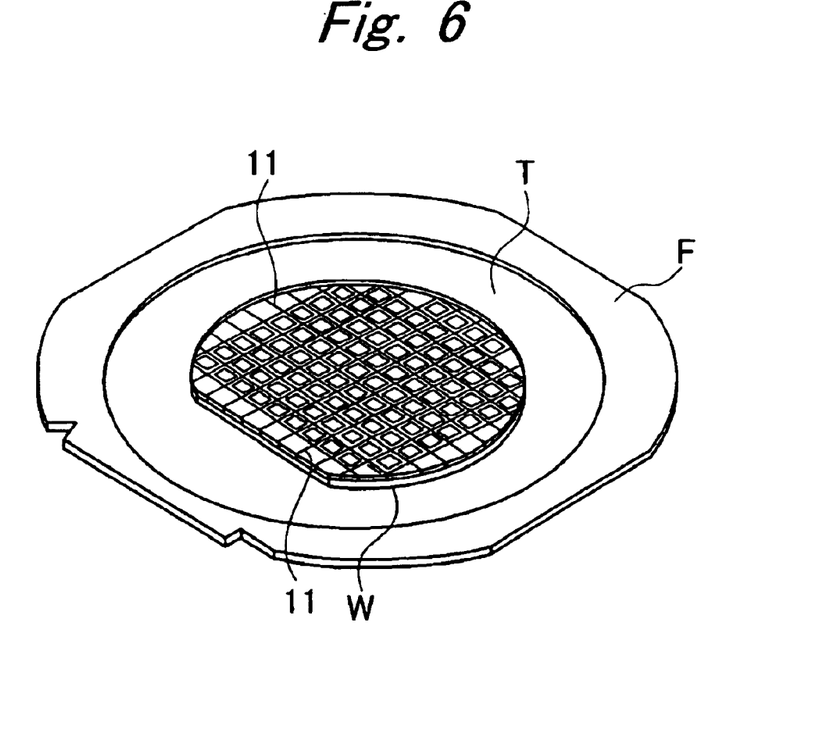
FIG. 6 is a perspective view of a wafer-and-frame combination with its masking tape member grooved in a lattice pattern.

Then, the chuck table 25 is rotated 90 degrees, and thereafter, the same cutting process is repeated. The grooves 11 are made crosswise in the tape member 10 to be exactly in conformity with the underlying crosswise streets of the semiconductor wafer (selective tape-removing step). The crosswise cutting of the masking tape member 10 need not use any photomasks and exposure equipment which are required in conventional light-exposure unmasking processes.

In the selective tape-removing step, if the rotary blade 28 is not precisely controlled, it may happen that the rotary blade 28 cuts into the street of the semiconductor wafer a bit, thereby causing the semiconductor wafer to be somewhat cracked or inner-stressed. Such minute defects, however, can be eliminated later in chemical etching.

Figure 7:
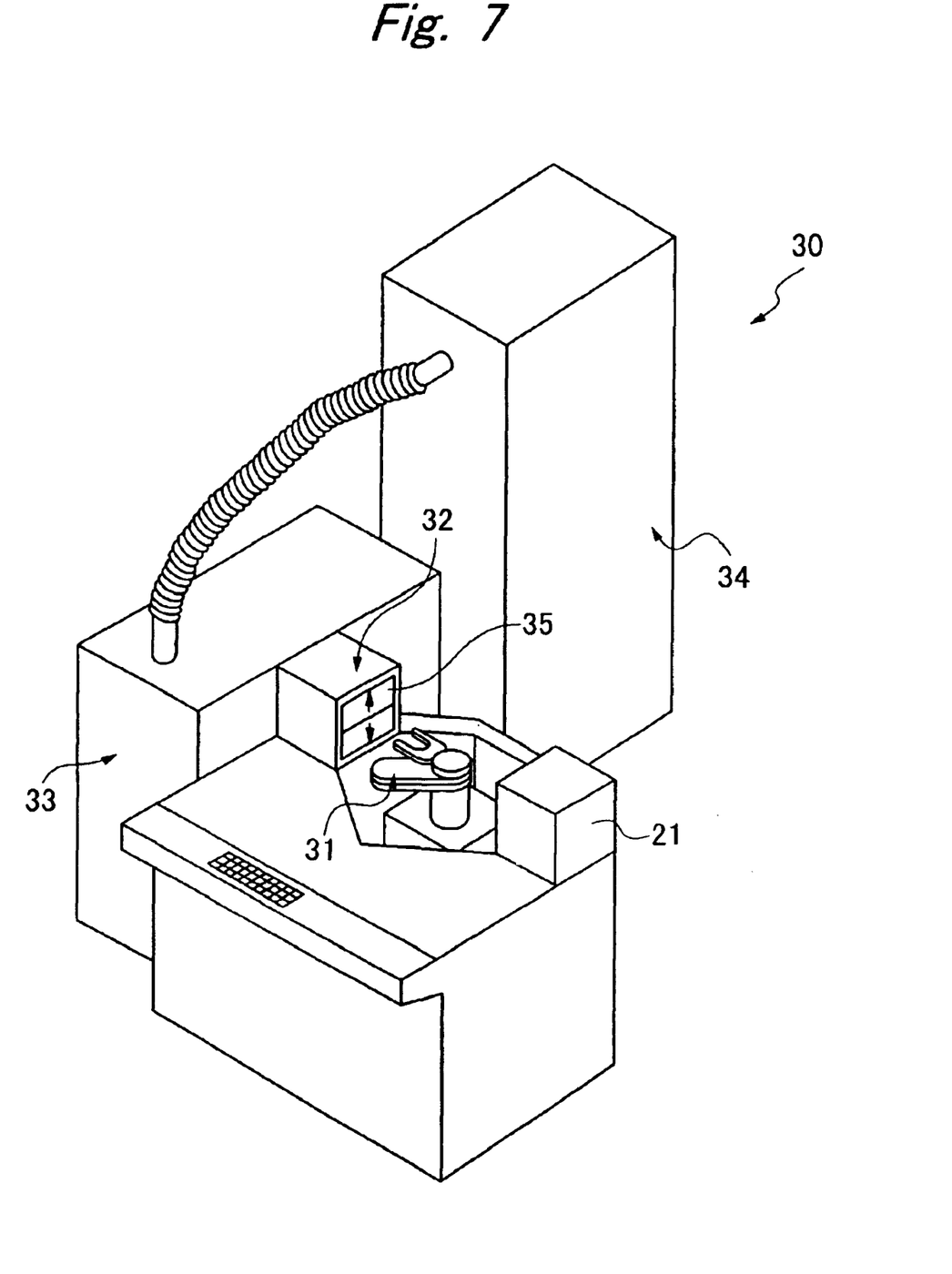
FIG. 7 is a perspective view of a dry-etching apparatus for use in the etching and dividing step.

When the selective tape-removing step is completed on all the semiconductor wafers, they are contained in the cassette 21, and the cassette 21 is transported to a subsequent dicing section. A dry-etching apparatus 30 as shown in FIG. 7 is used in carrying out the dry-etching process. Instead, the wet-etching process may be used as well.

Referring to FIG. 7, the dry-etching apparatus 30 comprises: a wafer taking-in and -out means 31 for taking out selectively uncovered semiconductor wafers W from the cassette 21 and for putting chemically-etched and diced wafers W in the cassette 21; a wafer taking-in and -out chamber 32 for receiving semiconductor wafers W from the wafer taking-in and -out means 31 and for accommodating the semiconductor wafers therein; a dry-etching treatment chamber 33 for carrying out the dry-etching treatment therein; and a gas supply 34 for feeding the dry-etching treatment chamber 33 with etching gas.

Figure 8:
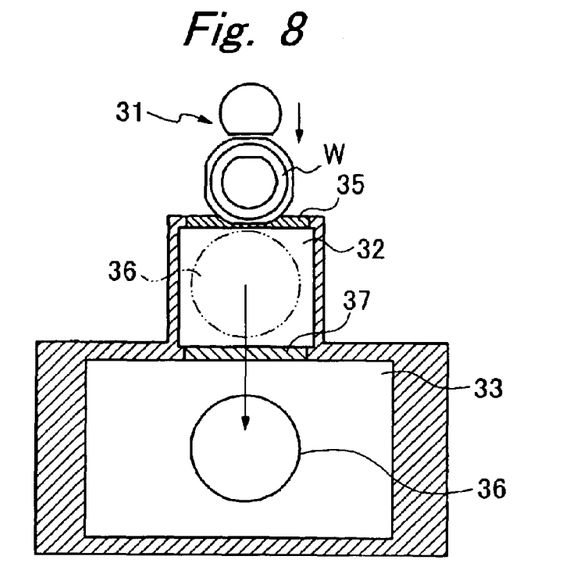
FIG. 8 is a sectional view of the wafer taking-in and -out chamber and a processing chamber of the dry etching apparatus.

The wafer taking-in and -out means 31 takes out selectively uncovered wafers W one by one from the cassette 21. Then, a first gate 35 of the wafer taking-in and -out chamber 32 is opened, allowing the semiconductor wafer W to be laid on a holder 36 in the chamber 32 as shown in FIG. 8.

The wafer taking-in and -out chamber 32 is isolated from the dry-etching treatment chamber 33 by a second gate 37. The holder 36 is responsive to opening of the second gate 37 for moving from the chamber 32 to the chamber 33 and vice versa.

Figure 9:
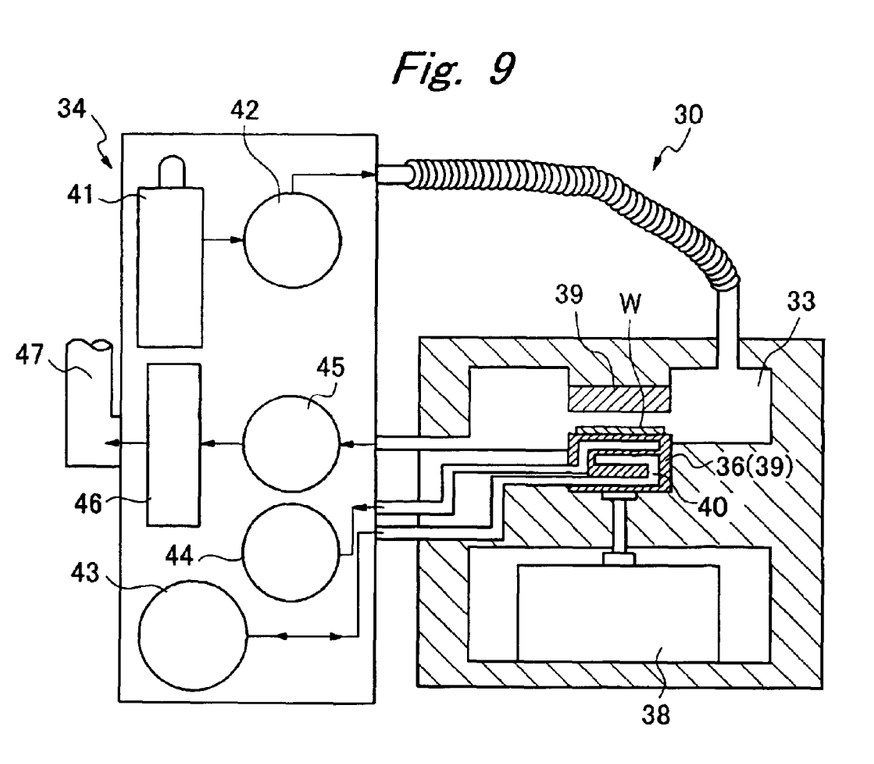
FIG. 9 shows the structure of the processing chamber and a gas supply of the dry etching apparatus.

As seen from FIG. 9, upper and lower electrodes 39 are connected to a high-frequency power supply-and-tuner unit 38 in the dry-etching treatment chamber 33, where the upper and lower electrodes 39 are opposed to each other. In this particular example, one of the opposite electrodes 39 takes the part of the holder 36. The holder 36 is equipped with a cooling means 40 for cooling the semiconductor wafer W.

The gas supply 34 comprises a tank 41 for storing etching gas, a pump 42 for directing the etching gas from the tank 41 to the dry-etching treatment chamber 33, a coolant circulator 43 for supplying cooling water to the cooling means 40, a suction pump 44 for applying negative pressure to the holder 36, another suction pump 45 for sucking the etching gas from the dry-etching treatment chamber 33, and a filter 46 for neutralizing the used etching gas drawn by the suction pump 45, where the filter 46 is positioned before a discharge unit 47 for discharging the so neutralized etching gas.

When the selectively uncovered wafers W are dry-etched, the first gate 35 of the chamber 32 is opened, and the wafer taking-in and -out means 31 carries a selectively uncovered semiconductor wafer W in the direction indicated by an arrow in FIG. 8 to put it on the holder 36 in the chamber 32 with its front face up. Then, the first gate 35 is closed for evacuating the chamber 32.

Then, the second gate 37 is opened to allow the holder 36 to move into the dry-etching treatment chamber 33, whereby the semiconductor wafer W is put in the chamber 33. Subsequently, while an etching gas such as a thin fluoride gas is fed into the chamber 33 with the aid of the pump 42, a high-frequency voltage is applied to the high-frequency electrodes 39 from the high-frequency power supply-and-tuner 38 in order to generate plasma over the wafer W, whereby the wafer is dry-etched. At the same time, cooling water is supplied from the coolant circulator 43 to the cooling means 40.

Figure 10:
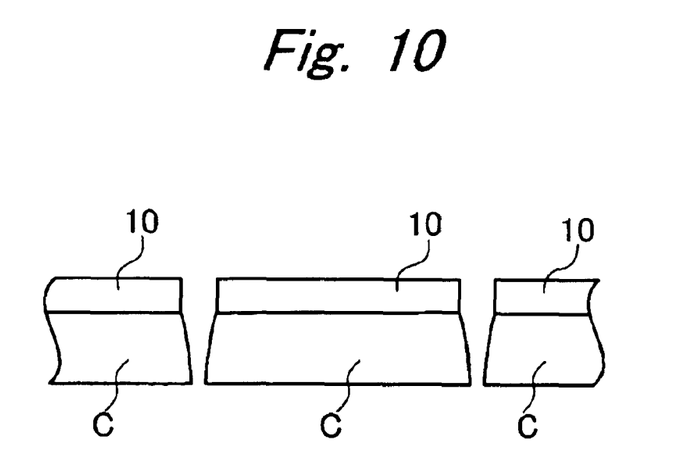
FIG. 10 is a side view of the semiconductor wafer-and-tape member just after being chemically etched to dice.

Since the portions of the tape member lying on the streets are removed in the selective tape-removing step, while other portions of the tape remain unremoved, the remaining portions of the tape serve as masking member on the semiconductor wafer W in etching, whereby the streets of the semiconductor wafer W are chemically etched. The exposed portions of the semiconductor wafer W are dry-etched, so that the crosswise streets may erode to divide the wafer into the individual semiconductor chips, as seen from FIG. 10 (etching and dividing step).

The tape member 10 may be made either of an erosible material or a non-erosible material. In case the tape member 10 is erosible, a thickness of the erosible tape member is determined depending on a thickness of semiconductor wafer to erode to be diced so that the tape member still remains on the semiconductor chips C even after the semiconductor wafer is completely diced. In case the tape member 10 is of non-erosible material, its thickness can be determined irrespective of the thickness of the semiconductor wafer.

After completing the etching and dividing step, the used etching gas is drawn from the dry-etching treatment chamber 33 by the suction pump 45, and it is neutralized in the filter 46 to be drained away through the discharge unit 47. Then, the chamber 33 is evacuated, and the second gate 37 is opened, thereby allowing the holder 36 to carry the dry-etched semiconductor wafer W into the wafer taking-in and -out chamber 32. Then, the second gate 37 is closed.

When the dry-etched or diced wafer is moved into the chamber 32, the first gate 35 is opened, and the taking-in and -out means 31 transfers the dry-etched semiconductor wafer W from the chamber 32 to the cassette 21.

All the semiconductor wafers W are treated as described above, and the diced wafers are put in the cassette 21. Each diced semiconductor wafer sticks to the tape member 10, retaining its shape as a whole disc.

Figure 11:
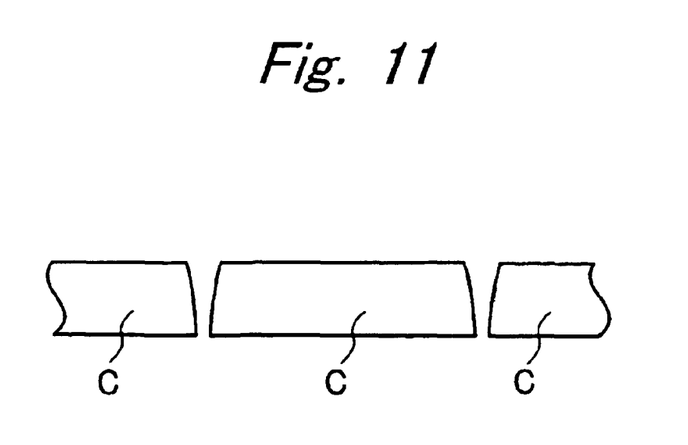
FIG. 11 is a similar side view, but showing the semiconductor wafer having the tape member removed therefrom.

Then, the tape member 10 is removed from the diced semiconductor wafer to provide individual semiconductor chips C as seen from FIG. 11.

Since the semiconductor chips are diced not by mechanical cutting with use of rotary blade, but by chemical etching, the semiconductor chips thus provided have high quality free of any defects such as cracks or inner stresses, which would be caused if the semiconductor wafers were diced with a rotary blade. Such defects are most likely to be caused for semiconductor wafers having a thickness of 50 $\mu$m or less. The dry-etching manner can be advantageously used in dicing such thin wafers.

As is well known, the time involved for dry-etching increases in proportion to increase of the thickness of the semiconductor wafer to be treated. Consequentially, if semiconductor wafers have a thickness of 50 $\mu$m or less, the time involved for dry-etching the semiconductor wafers is short enough to avoid any significant lowering of manufacturing efficiency thereof. Even in this regard, the method according to the present invention would be found invaluable.

In case a cover layer such as an alignment mark which cannot be removed by the chemical etching is formed on the streets of a semiconductor wafer W, the rotary blade 28 is controlled to cut deep enough to reach and remove the layer on the streets, thereby permitting the semiconductor wafers to be completely etched to be diced.

INDUSTRIAL APPLICABILITY

As is described above, according to the method for dicing semiconductor wafer of the present invention, the tape member is applied to the circuit face of the semiconductor wafer, and it is subjected to the selective tape-removing step, whereby the portions of the tape lying along the crosswise streets are cut and removed. The semiconductor wafer thus partly uncovered is chemical-etched in the exposed crosswise streets to be divided into individual semiconductor chips. Advantageously, the etching process needs neither photomasks nor exposure equipment. By virtue of use of chemical etching the so provided semiconductor chips are free of cracks, and are high in flexural strength, thereby the quality of the semiconductor chips can be improved. Especially, in case semiconductor wafers have a thickness of 50 $\mu$m or less, they are most likely to cause cracks or inner-stress when being mechanically cut into semiconductor chips. Even such thin semiconductor wafers can be hardly cracked or inner-stressed when being chemically etched to divide into individual semiconductor chips.

Usually in semiconductor factories, mechanical dicing apparatuses are installed, and therefore, such existing equipment can be used in carrying out the dicing method according to the present invention. No extra investment is required for the purpose and accordingly it is economical.

Still advantageously, it does not take a long time to dice 50 or less micron-thick wafers by chemical etching although the time involved for erosion significantly increases for thicker wafers, and accordingly the productivity can be ensured.

As for conventional method including masking semiconductor wafers with a photoresist coating, the photoresist coating is often formed unevenly in thickness all over the surface of the wafer. Moreover, since the photoresist coating is difficult to be formed thick enough to remain even after the semiconductor wafer is completely eroded and diced, the photoresist coating is undesirably etched and removed before the wafer is diced into individual semiconductor chips. In the method according to the present invention, a tape member is used as a masking member, and is mechanically cut at portions lying on the crosswise streets of the wafer. Therefore, the masking member can be thick enough to remain even after the chemical etching step, whereby the problems mentioned above can effectively be solved, and the semiconductor wafers can be diced without fail.

What is claimed is:

1. A method for dicing a semiconductor wafer having regions sectioned by crosswise streets into individual semiconductor chips, each of the regions having a circuit pattern formed therein, comprising:

a masking step of covering the semiconductor wafer with a tape member to cover the circuit face of the semiconductor wafer on which the circuit patterns are formed;

a selective tape-removing step of mechanically cutting and removing selectively crosswise portions of the tape member which are exactly aligned with the underlying crosswise streets of the semiconductor wafer; and an etching and dividing step of chemically etching the semiconductor wafer having the crosswise streets uncovered, whereby the crosswise streets are permitted to erode so that the semiconductor wafer is divided into individual semiconductor chips.

2. A dicing method according to claim 1, wherein the tape member has a thickness determined in consideration of a depth of the semiconductor wafer to be eroded and divided into individual chips in the etching and dividing step.

3. A dicing method according to claim 1, wherein if a cover layer which cannot be removed by the chemical etching is formed on the crosswise street pattern, the cover layer on the crosswise street pattern is removed by cutting in the selective tape-removing step.

4. A dicing method according to claim 1, wherein the chemical etching in the etching and dividing step is dry etching.

5. A dicing method according to claim 2, wherein if a cover layer which cannot be removed by the chemical etching is formed on the crosswise street pattern, the cover layer on the crosswise street pattern is removed by cutting in the selective tape-removing step.

* * * * *